(12) United States Patent
Shen

(10) Patent No.: US 6,921,715 B2
(45) Date of Patent: Jul. 26, 2005

(54) SEMICONDUCTOR PACKAGE AND METHOD OF FABRICATING SAME

(76) Inventor: Yu-Nung Shen, No. 60, Lane 328, Li-Shan Street, Nei-Hu Dist., Taipei City (TW)

( * ) Notice: Subject to any disclaimer, the term of this patent is extended or adjusted under 35 U.S.C. 154(b) by 0 days.

(21) Appl. No.: 10/833,151

(22) Filed: Apr. 28, 2004

(65) Prior Publication Data

US 2004/0219712 A1 Nov. 4, 2004

(30) Foreign Application Priority Data

May 2, 2003 (TW) .................................... 92112162 A

(51) Int. Cl.$^7$ ................................................ H01L 21/44
(52) U.S. Cl. ..................... 438/612; 438/613; 438/614; 257/780; 257/774; 257/738
(58) Field of Search ................................. 438/612–614; 257/780, 774, 738

(56) References Cited

U.S. PATENT DOCUMENTS 5,431,328 A * 7/1995 Chang et al. .......... 228/180.22
5,977,632 A * 11/1999 Beddingfield ............... 257/737
6,337,445 B1 * 1/2002 Abbott et al. ............... 174/260
6,500,693 B2 * 12/2002 Noguchi ..................... 438/106
6,573,458 B1 * 6/2003 Matsubara et al. ......... 174/260
6,756,184 B2 * 6/2004 Peng et al. .................. 430/311

* cited by examiner

Primary Examiner—Luan Thai
(74) Attorney, Agent, or Firm—Rosenberg, Klein & Lee

(57) ABSTRACT

A semiconductor package and a method of fabricating a semiconductor package are provided. The method of fabricating a semiconductor package provides a semiconductor die having a pad mounting surface and a plurality of bonding pads disposed on the pad mounting surface; attaches a medium on each of the bonding pads; arranges a spherical element on each of the bonding pads via the corresponding medium; forms an electroplating layer on each of the spherical elements and around the corresponding medium; and coats a protection layer on the pad mounting surface of the semiconductor die and the electroplating layers by means of a photoresist material. Furthermore, the protection layer is patterned and etched so as to expose the top portions of the electroplating layers.

13 Claims, 4 Drawing Sheets

SEMICONDUCTOR PACKAGE AND METHOD OF FABRICATING SAME

BACKGROUND OF THE INVENTION

1. Field of the Invention

The present invention relates to a semiconductor package and, more particularly, to a semiconductor package and a method of fabricating a semiconductor package, which can reduce packaging time and provide a steadier product structure.

2. Description of the Related Art

The formation of a solder ball on a bonding pad of a semiconductor die will now be explained with the reference of FIGS. 10 and 11.

First, as shown in FIG. 10, a semiconductor die 10 is prepared. The semiconductor die 10 has at least one bonding pad 11 on its pad mounting surface. A layer of solder paste 13 is applied on the bonding pad 11 of the semiconductor die 10. As shown in FIG. 11, a solder ball 12 is formed from the layer of solder paste 13 in a reflow process, such that a semiconductor package is constituted.

However, in the formation of the solder ball on the bonding pad of the semiconductor die as described above, the reflow process is lengthy, causing the whole manufacturing time of the semiconductor package to increase, and thus the quantity of output is reduced and the manufacturing cost is increased. Moreover, the solder ball 12 will be easily peeled from the bonding pad 11 of the semiconductor die 10. Furthermore, a height of the solder ball 12 from the surface of the semiconductor die 10 to a top end of the solder ball 12 is difficult to control during the manufacturing process, and hence the solder balls 12 will obtain different heights, respectively. Thus, it is easy to generate poor contact or no connection when the semiconductor package is electrically connected to an external circuit.

SUMMARY OF THE INVENTION

It is therefore a principal object of the present invention to provide a semiconductor package and a method of fabricating a semiconductor package, which can reduce packaging time and obtain steadier product structure. Furthermore, the present invention has been accomplished to eliminate the aforesaid problem.

To achieve the above object, one feature of the present invention is to provide a method of fabricating a semiconductor package, including the steps of providing a semiconductor die having a pad mounting surface and a plurality of bonding pads disposed on the pad mounting surface; attaching a medium on each of the bonding pads; arranging a spherical element on each of the bonding pads via the corresponding medium; forming an electroplating layer on each of the spherical element and around the corresponding medium; and coating a protection layer on the pad mounting surface of the semiconductor die and the electroplating layers by means of a photoresist material. The protection layer is patterned and etched so as to expose the top portions of the electroplating layers.

Another feature of the present invention provides a method of fabricating a semiconductor package, including the steps of providing a semiconductor die having a pad mounting surface and a plurality of bonding pads disposed on the pad mounting surface; forming a metal conductive layer on each of the bonding pads by means of electroplating; forming a conductor holder on each of the metal conductive layers, each of the conductor holders defining an indentation corresponding to the metal conductive layer; arranging a conductor in the indentation of each of the conductor holders, each of the conductors being electrically connected to the corresponding metal conductive layer in a reflow process; and coating a protection layer on the pad mounting surface of the semiconductor die and the conductors by means of a photoresist material. The protection layer is patterned and etched so as to expose the top portions of the conductors.

Yet another feature of the present invention provides a semiconductor package including a semiconductor die having a pad mounting surface and a plurality of bonding pads disposed on the pad mounting surface; a medium attached on each of the bonding pads of the semiconductor die; a spherical element arranged on each of the bonding pads via the corresponding medium; an electroplating layer formed on each of the spherical elements and around the corresponding medium; and a protection layer coated on the pad mounting surface of the semiconductor die and the electroplating layers by means of a photoresist material. The protection layer is patterned and etched so as to expose the top portions of the electroplating layers.

A further feature of the present invention provides a semiconductor package including a semiconductor die having a pad mounting surface and a plurality of bonding pads disposed on the pad mounting surface; a metal conductive layer formed on each of the bonding pads by means of electroplating; a conductor holder formed on each of the metal conductive layers, each of the conductor holders defining an indentation corresponding to the metal conductive layer; a conductor arranged in the indentation of each of the conductor holders, each of the conductors being electrically connected to the corresponding metal conductive layer in a reflow process; and a protection layer coated on the pad mounting surface of the semiconductor die and the conductors by means of a photoresist material. The protection layer is patterned and etched so as to expose the top portions of the conductors.

To provide a further understanding of the invention, the following detailed description illustrates embodiments and examples of the invention, this detailed description being provided only for illustration of the invention.

BRIEF DESCRIPTION OF THE DRAWINGS

The drawings included herein provide a further understanding of the invention. A brief introduction of the drawings is as follows.

DETAILED DESCRIPTION OF THE EMBODIMENTS

Reference is now made to the drawings, which are for the purpose of illustrating preferred embodiments of the present invention, only, and not for the purpose of limiting the same.

FIGS. 1–4 are cross-sectional views illustrating a sequence of steps for manufacturing the semiconductor package in accordance with a first embodiment of the present invention.

Figure 1:
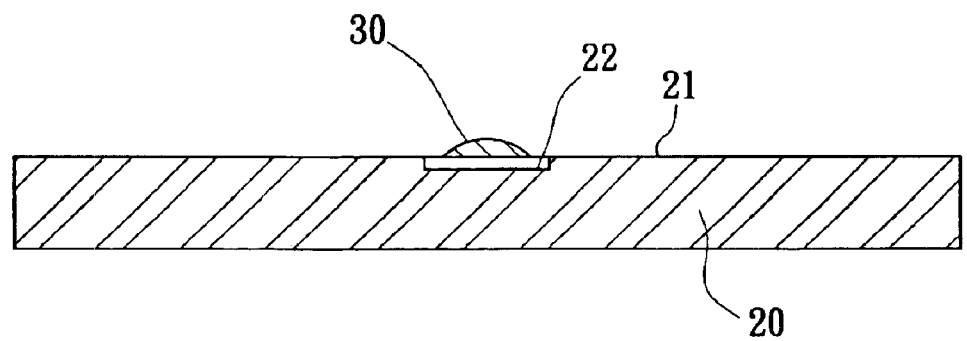
FIGS. 1–4 are cross-sectional views illustrating a sequence of steps for manufacturing the semiconductor package in accordance with a first embodiment of the present invention.

First, as shown in FIG. 1, a semiconductor die 20 having a pad mounting surface 21 and a plurality of bonding pads 22 disposed on the pad mounting surface 21 (only showing single bonding pad in the drawing) is provided. A medium 30 is attached on a center portion of each of the bonding pads 22 of the semiconductor die 20 as a fastening means. The medium 30 is a conductive material or a non-conductive material.

It should be noted that the semiconductor die 20 can be an individual semiconductor die diced from a wafer, or can be one of the semiconductor dies of a wafer.

Figure 2:
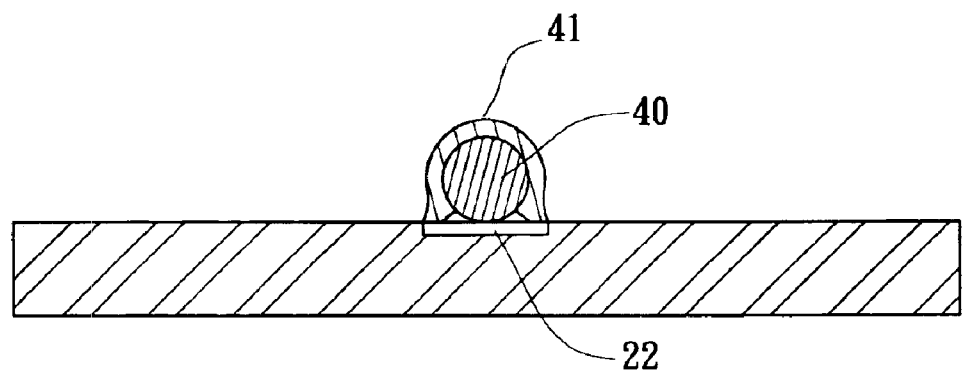

Next, a spherical element 40 is arranged on each of the bonding pads 22 via the corresponding medium 30, shown in FIG. 2. It should be noted that the spherical element 40 can be a conductive material or a non-conductive material. Subsequently, an electroplating layer 41 is formed on each of the spherical elements 40 by means of electroplating, and each of the electroplating layers 41 extends to the corresponding bonding pad 22 and around the corresponding medium 30.

Figure 3:
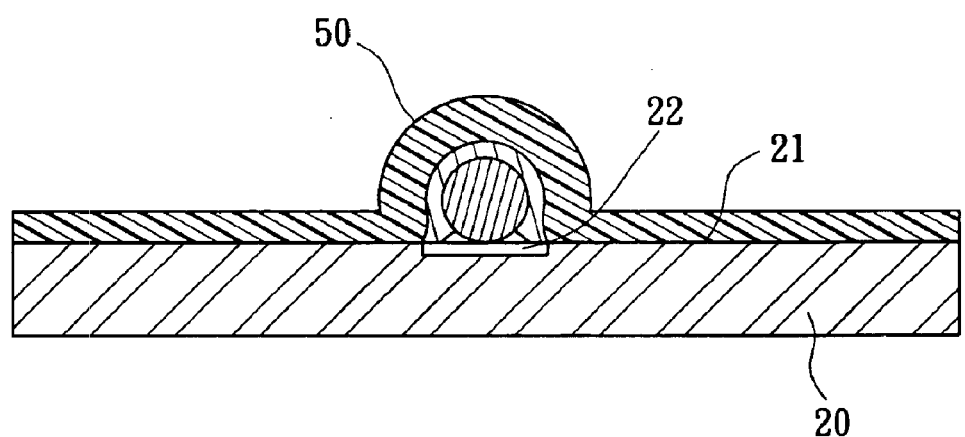
Figure 4:
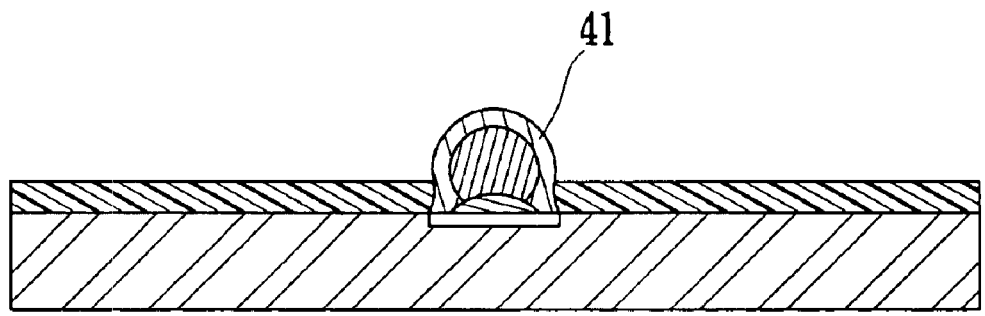

As shown in FIG. 3, a protection layer 50 is coated on the pad mounting surface 21 of the semiconductor die 20 and the electroplating layers 41 by means of a photoresist material. Next, the protection layer 50 is patterned and etched so as to expose the top portions of the electroplating layers 41 for electrically connecting with an external circuit.

In comparing the first embodiment of the present invention with the prior art, peeling of the conductor from the respective one of the bonding pads 22 will not occur due to the design of the medium 30, the spherical element 40 and the electroplating layer 41 and the protection layer 50.

FIGS. 5–9 are cross-sectional views illustrating a sequence of steps for manufacturing the semiconductor package in accordance with a second embodiment of the present invention.

Figure 5:
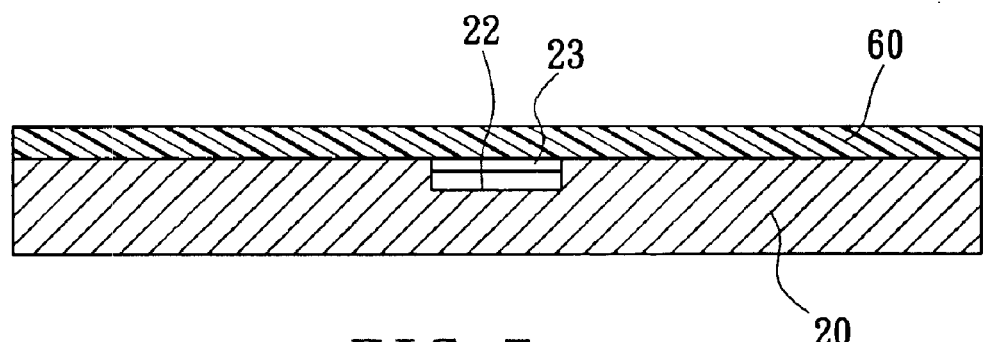
FIGS. 5–9 are cross-sectional views illustrating a sequence of steps for manufacturing the semiconductor package in accordance with a second embodiment of the present invention.

As shown in FIG. 5, a semiconductor die 20 having a pad mounting surface 21 and a plurality of bonding pads 22 disposed on the pad mounting surface 21 (only showing single bonding pad in the drawing) is provided. A metal conductive layer 23 is formed on each of the bonding pads 22. Further, a covering layer 60 is coated on the pad mounting surface 21 of the semiconductor die 20 by means of a photoresist material.

Figure 6:
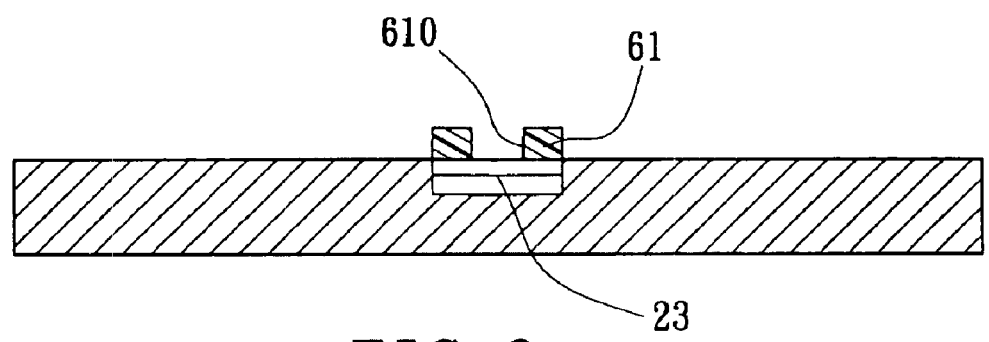

Next, the covering layer 60 is patterned and etched so as to form a plurality of conductor holders 61 on the respective metal conductive layers 23. Each of the conductor holders 61 has an indentation 610 down to the corresponding metal conductive layer 23, as shown in FIG. 6.

Figure 7:
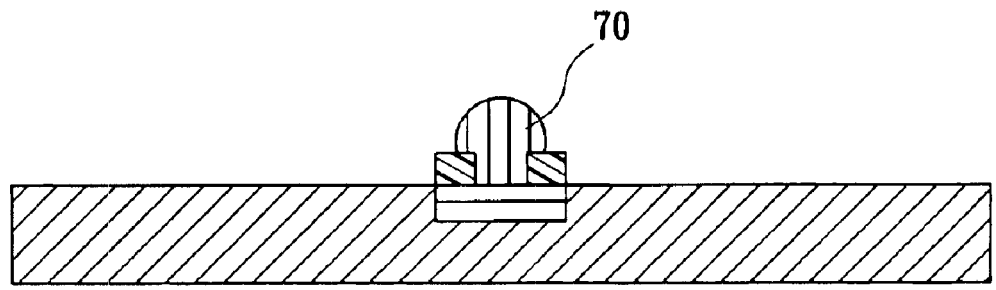
Figure 8:
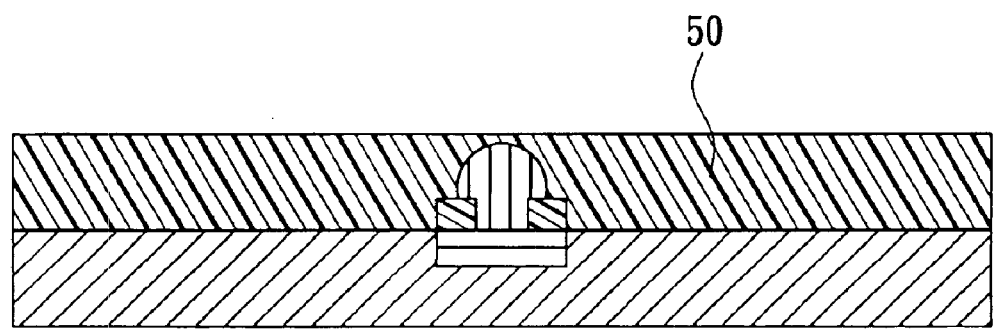
Figure 9:
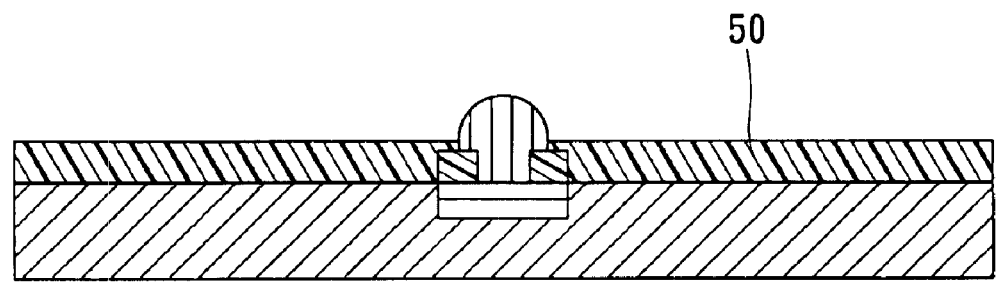
Figure 10:
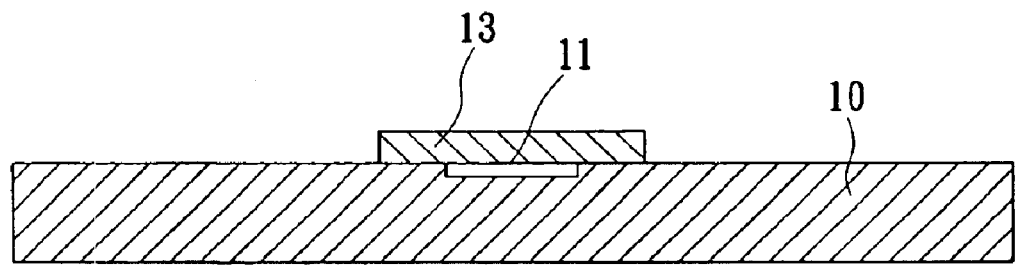
FIGS. 10–11 are cross-sectional views illustrating a sequence of steps for forming a conductor on a bonding pad of a semiconductor die in accordance with a prior art.
Figure 11:
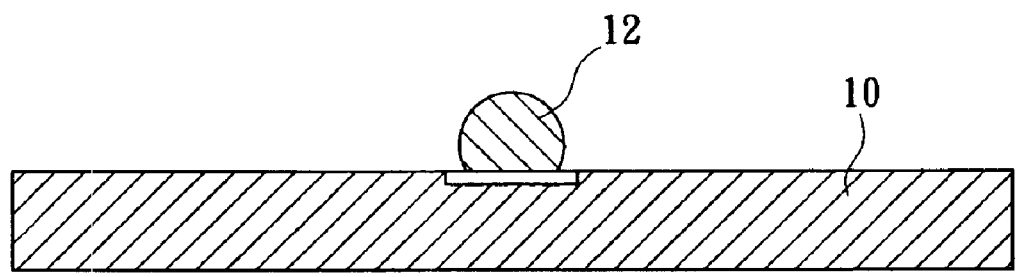

Subsequently, a conductor 70, such as a solder ball is arranged in the indentation 610 of each of the conductor holders 61, as shown in FIG. 7. The conductor 70 is electrically connected to the corresponding metal conductive layer 23 in a reflow process. Furthermore, a height of the conductor 70 from the pad mounting surface 21 of the semiconductor die 20 to a top end of the conductor 70 will remain unchanged during the reflow process due to the design of the indentation 610 of the conductor holder 61. A protection layer 50 is coated on the pad mounting surface 21 of the semiconductor die 20 and the conductors 70 by means of a photoresist material, shown in FIG. 8.

Next, the protection layer 50 is patterned and etched so as to expose the top portions of the conductors 70 for electrically connecting with an external circuit.

There has thus been described a new, novel and heretofore unobvious semiconductor package and a method of fabricating a semiconductor package which eliminates the aforesaid problem in the prior art. Furthermore, those skilled in the art will readily appreciate that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. A method of fabricating a semiconductor package, comprising the steps of:

providing a semiconductor die having a pad mounting surface and a plurality of bonding pads disposed on the pad mounting surface;

attaching a medium on each of the bonding pads;

arranging a spherical element on each of the bonding pads via the corresponding medium;

forming an electroplating layer on each of the spherical elements and around the corresponding medium; and coating a protection layer on the pad mounting surface of the semiconductor die and the electroplating layers by means of a photoresist material;

wherein the protection layer is patterned and etched so as to expose top portions of the electroplating layers.

2. The method of claim 1, wherein the medium is a conductive material.

3. The method of claim 1, wherein the medium is a non-conductive material.

4. The method of claim 1, wherein the spherical element is a conductive material.

5. The method of claim 1, wherein the spherical element is a non-conductive material.

6. A method of fabricating a semiconductor package, comprising the steps of:

providing a semiconductor die having a pad mounting surface and a plurality of bonding pads disposed on the pad mounting surface;

forming a metal conductive layer on each of the bonding pads by means of electroplating;

forming a conductor holder on each of the metal conductive layers, wherein each of the conductor holders defines an indentation communicating with the corresponding metal conductive layer;

arranging a conductor in the indentation of each of the conductor holders, wherein each of the conductors is electrically connected to the corresponding metal conductive layer in a reflow process; and coating a protection layer on the pad mounting surface of the semiconductor die and the conductors by means of a photoresist material;

wherein the protection layer is patterned and etched so as to expose top portions of the conductors.

7. The method of claim 6, wherein the step for forming the conductor holder on the metal conductive layer includes the steps of:

coating a covering layer on the pad mounting surface of the semiconductor die by means of a photoresist material; and patterning and etching the covering layer to form said conductor holders on each of bonding pads.

8. A semiconductor package comprising:

a semiconductor die having a pad mounting surface and a plurality of bonding pads disposed on the pad mounting surface;

a medium attached on each of the bonding pads of the semiconductor die;

a spherical element arranged on each of the bonding pads via the corresponding medium;

an electroplating layer formed on each of the spherical elements and around the corresponding medium; and a protection layer coated on the pad mounting surface of the semiconductor die and the electroplating layers by means of a photoresist material;

wherein the protection layer is patterned and etched so as to expose top portions of the electroplating layers.

9. The semiconductor package of claim 8, wherein the medium is a conductive material.

10. The semiconductor package of claim 8, wherein the medium is a non-conductive material.

11. The semiconductor package of claim 8, wherein the spherical element is a conductive material.

12. The semiconductor package of claim 8, wherein the spherical element is a non-conductive material.

13. A semiconductor package, comprising:

a semiconductor die having a pad mounting surface and a plurality of bonding pads disposed on the pad mounting surface;

a metal conductive layer formed on each of the bonding pads by means of electroplating;

a conductor holder formed on each of the metal conductive layers, wherein each of the conductor holders defines an indentation communicating with the corresponding metal conductive layer;

a conductor arranged in the indentation of each of the conductor holders, wherein each of the conductors is electrically connected to the corresponding metal conductive layer in a reflow process; and a protection layer coated on the pad mounting surface of the semiconductor die and the conductors by means of a photoresist material;

wherein the protection layer is patterned and etched so as to expose top portions of the conductors.

* * * * *